(12) United States Patent
Puebla Hellmann et al.

(10) Patent No.: US 11,673,798 B2
(45) Date of Patent: Jun. 13, 2023

(54) MICROFLUIDIC DEVICES WITH ELECTRODES FORMED AS PHYSICALLY SEPARATED SECTIONS OF MICROCHANNEL SIDE WALLS

(71) Applicants: International Business Machines Corporation, Armonk, NY (US); THE UNIVERSITY OF BASEL, Basel (CH)

(72) Inventors: Gabriel Fernando Puebla Hellmann, Rueschlikon (CH); Diego Monserrat Lopez, Zurich (CH); Ute Drechsler, Rueschlikon (CH); Marcel Mayor, Basel (CH); Emanuel Marc Loertscher, Bonstetten (CH)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 17/084,389

(22) Filed: Oct. 29, 2020

(65) Prior Publication Data
US 2022/0135399 A1 May 5, 2022

(51) Int. Cl.
| | | |
|---|---|---|
| B81C 1/00 | (2006.01) | |
| B81B 1/00 | (2006.01) | |
| B01L 3/00 | (2006.01) | |

(52) U.S. Cl.
CPC .... B81C 1/00119 (2013.01); B01L 3/502707 (2013.01); B01L 3/502715 (2013.01);
(Continued)

(58) Field of Classification Search
CPC ......... B81C 1/00119; B81C 2201/0132; B81C 2201/0156; B81C 2201/0159;
(Continued)

(56) References Cited

U.S. PATENT DOCUMENTS

| | | |
|---|---|---|
| 6,765,227 B1 | 7/2004 | Yu et al. |
| 7,420,147 B2 | 9/2008 | Faris |

(Continued)

FOREIGN PATENT DOCUMENTS

| | | |
|---|---|---|
| KR | 19980058417 A | 10/1998 |
| WO | WO2019166875 A1 | 9/2019 |

OTHER PUBLICATIONS

Silicon Valley Microelectronics, Silicon on Insulator (SOI) Wafers, Downloaded Nov. 12, 2019, 6 pages https://www.svmi.com/silicon-wafers/silicon-insulator-wafers/.

*Primary Examiner* — Brian J. Sines
(74) *Attorney, Agent, or Firm* — Samuel Waldbaum; Otterstedt & Kammer PLLC

(57) ABSTRACT

A device includes a first layer of an electrically insulating material and a second layer of a non-electrically insulating material (e.g., semiconductor or electrically conductive) extending on the first layer. The second layer is structured so as to define opposite, lateral walls of a microchannel, a bottom wall of which is defined by an exposed surface of the first layer. The second layer is further structured to form one or more electrical insulation barriers; each barrier includes a line of through holes, each surrounded by an oxidized region of the material of the second layer. The through holes alternate with oxidized portions of the oxidized region along the line. Each barrier extends, as a whole, laterally across the second layer up to one of the lateral walls and delimits two sections of the second layer on each side of the barrier and on a same side of the microchannel.

20 Claims, 8 Drawing Sheets

(52) U.S. Cl.
CPC ........... *B81B 1/002* (2013.01); *B01L 2200/12* (2013.01); *B01L 2300/12* (2013.01); *B01L 2300/168* (2013.01); *B81B 2201/058* (2013.01); *B81B 2203/0353* (2013.01); *B81B 2203/04* (2013.01); *B81C 2201/0132* (2013.01); *B81C 2201/0159* (2013.01); *B81C 2201/0178* (2013.01)

(58) Field of Classification Search
CPC .............. B01L 2200/12; B01L 3/5027; B01L 3/502715; B01L 2300/12; B01L 3/502707; B81B 2203/0353; B81B 2203/04
See application file for complete search history.

(56) References Cited

U.S. PATENT DOCUMENTS 10,159,976 B2 * 12/2018 Delamarche ...... B01L 3/502707
2014/0151803 A1     6/2014 Cheng et al.

\* cited by examiner

MICROFLUIDIC DEVICES WITH ELECTRODES FORMED AS PHYSICALLY SEPARATED SECTIONS OF MICROCHANNEL SIDE WALLS

STATEMENT REGARDING FEDERALLY SPONSORED RESEARCH OR DEVELOPMENT

This invention was developed within the framework of the National Centers of Competence in Research (NCCR) and with financial support from the Swiss National Science Foundation.

BACKGROUND

The invention relates in general to the field of microfluidic devices, i.e., devices comprising microchannels, and microchannel-based systems comprising such devices. In particular, it is directed to a microfluidic device, wherein entire sections of a layer of the device are electrically insulated thanks to electrical insulation barriers that extend across this layer up to the microchannel, whereby electrodes can be directly formed in the side walls of a microchannel.

Microfluidics deals with the precise control and manipulation of small volumes of fluids such as liquids and gases. Typically, such volumes are in the sub-milliliter range and are constrained to micrometer-length scale channels. Volumes well below one nanoliter can be reached by fabricating structures with lateral dimensions in the micrometer range.

Microfluidic devices generally refer to microfabricated devices, which are used for pumping, sampling, mixing, analyzing and dosing fluids. Many microfluidic devices have user chip interfaces and closed flow paths. Closed flow paths facilitate the integration of functional elements (e.g., heaters, mixers, pumps, UV detector, valves, etc.) into one device while minimizing problems related to leaks and evaporation. The analysis of liquid samples often requires a series of steps (e.g., filtration, dissolution of reagents, heating, washing, reading of signal), which may also be remotely performed via a connected device or server (e.g., optical spectroscopy and electrical measurements inside microfluidic channels).

Microchannel-based systems allow users to handle, manipulate, or characterize liquids, gases, particles, droplets, etc., thanks to the spatial confinement of the matter of interest. Electric fields can be used for a variety of tasks involving species such as molecules, clusters of molecules, proteins, cells, vesicles, particles, soft matter compartments, etc. To that aim, metallic electrodes are sometimes patterned onto one or more channels of the device, or in a layer that is structured so as to define boundaries of such a channel. Applications include generation of species (e.g. vesicles), mixing of species, ionizing neutral species, separating charged species, deflecting species, incorporating (e.g., injection, poration) species into others or decomposing them, electrochemical reactions, electrical probing, etc.

Many of such applications were demonstrated in microchannel systems based on polydimethylsiloxane (PDMS); such devices can be fabricated relatively easily by molding PDMS from a master stamp. The PDMS material is typically structured to form microchannels. Electrodes are then incorporated, e.g., on (i) a glass or semiconductor substrate (in contact with the PDMS material in which boundaries of the channel are defined), or (ii) within the PDMS material, by filling buried channels with metal.

While the first approach can yield small electrode separations (using a micro- or a nanolithography process), the characteristics of the resulting electric fields are typically not ideal with respect to the channel's geometry. That is, a substantial part of the electric field extends out-of-plane (i.e., above the plane of the electrodes on each side of the channel) and is non-uniform over the channel's cross-section, whereas a homogenous electric field is typically desired. The second approach allows more homogeneous electric fields to be achieved across the channel. Because the device must typically be kept leak-free and chemically inert, the electrodes cannot protrude directly into the channel, which constrains distances between the electrodes. Consequently, the second approach results in larger separation distances between the electrodes, which impacts the strength of the resulting electric field.

Therefore, the electrode designs evoked above result in inhomogeneous and/or low-intensity electric fields. Such drawbacks can be partly compensated by applying higher voltage biases. Doing so, however, has detrimental consequences. E.g., it requires high-voltage instrumentation (with voltages exceeding 1 kV), and may cause electromigration of soft metals, electrical break-down, electrostatic discharging inside the PDMS insulation, or leakage from the channel due to mechanical deformation of the soft and polarized PDMS material.

Therefore, a new approach is needed to design microchannel-based systems.

SUMMARY

According to a first aspect, the present invention is embodied as a microfluidic device. The device comprises a first layer of an electrically insulating material and a second layer of a non-electrically insulating material (e.g., a semiconductor or an electrically conductive material such as metal) extending on the first layer. The second layer is structured so as to define opposite, lateral walls of a microchannel, a bottom wall of which is defined by an exposed surface of the first layer, thereby defining physical boundaries of the microchannel. The second layer is further structured to form one or more electrical insulation barriers, where each barrier comprises a line of through holes, each surrounded by an oxidized region of the material of the second layer, whereby the through holes alternate with oxidized portions of said oxidized region along the line. In addition, each barrier extends, as a whole, laterally across the second layer up to one of the lateral walls. As a result, each barrier delimits two sections of the second layer on each side of the barrier and on a same side of the microchannel.

According to another aspect, the invention is embodied as a method of fabricating a microfluidic device such as described above. The method comprises the following steps. To start with, a first layer of an electrically insulating material and a second layer of a non-electrically insulating material are provided, wherein the second layer extends on the first layer. A lithographic resist is then patterned on top of the second layer, so as for the resist to define apertures corresponding, on the one hand, to a microchannel to be obtained, and, on the other hand, to openings, the latter forming one or more lines extending, each, laterally across the second layer toward the aperture corresponding to the microchannel to be obtained. Portions of the second layer are subsequently etched in accordance with the apertures patterned in the resist. The lithographic resist is used as a mask to protect residual portions of the second layer, to structure the second layer. This is done so as to obtain opposite, lateral walls of the microchannel, a bottom wall of which is defined by an exposed surface of the first layer. The bottom wall and the lateral walls will eventually form boundaries of the microchannel obtained. In addition, one or more lines of through holes are obtained though the etching process, where such lines correspond to the lines of openings in the patterned resist, respectively. Finally, exposed surfaces of the second layer are thermally oxidized to obtain one or more electrical insulation barriers. According to the fabrication method, each barrier of the one or more electrical insulation barriers obtained comprises a respective one of the lines of through holes, wherein each of the holes is surrounded by an oxidized region of the material of the second layer, whereby the through holes alternate with oxidized portions of said oxidized region along said respective one of the lines. Moreover, said each barrier extends, as a whole, laterally across the second layer up to one of the lateral walls, thereby delimiting two sections of the second layer on a same side of the microchannel.

Devices and fabrication methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

Figure 1A:
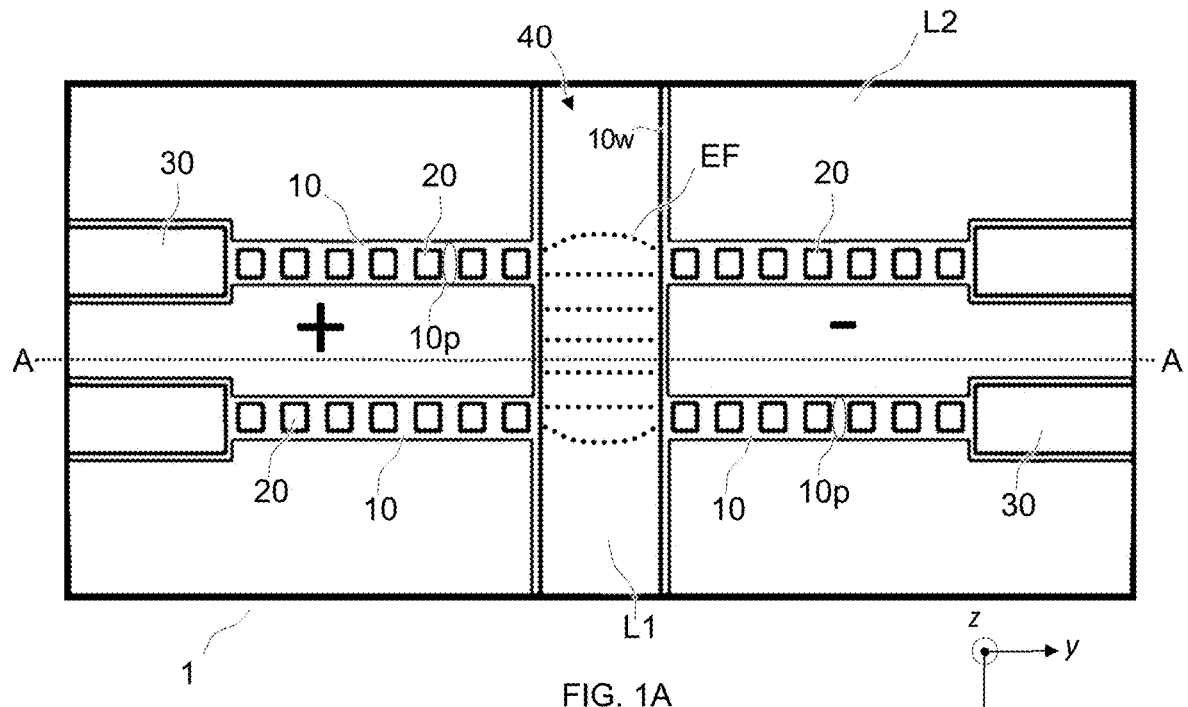
FIGS. 1A and 1B illustrates the basic principle of a microfluidic device according to embodiments, wherein a pair of electrodes are directly formed in the side walls of a microchannel, on opposite sides of the microchannel, and insulated by electrical insulation barriers.

Generally, the accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

The present Inventors propose a new approach for the design and fabrication of microfluidic devices and microchannel-based systems including such devices, wherein specific sections of a layer delimiting a microchannel can be electrically biased to generate electric fields across the microchannel, which do not have the above-mentioned drawbacks.

The following description is structured as follows. First, general embodiments and high-level variants are described (sect. 1). The next section addresses more specific embodiments and technical implementation details (sect. 2). Note, the present method and its variants are collectively referred to as the "present methods". All references Sij refer to fabrication steps of the flowchart of FIG. 7, while numeral references, as well as references Lk pertain to physical parts or components of the present devices.

Note, each of FIGS. 1A, 2A, 3A, 4A, and 5A show a top view and each of FIGS. 1B, 2B, 3B, 4B, and 5B show a corresponding 2D cross-sectional view of a microfluidic device at a given fabrication stage. FIG. 5C is a 3D view of the device shown in FIGS. 5A and 5B, in which neither the lid nor the electrical contact pads are shown, for the sake of depiction.

1. General Embodiments and High-Level Variants

In reference to FIGS. 1A, 1B, 4A, 4B, 5A, 5B, 5C, and 7, an aspect of the invention is first described, which concerns a microfluidic device 1, i.e., a device including at least one microchannel 40 having at least one characteristic dimension, which is at most in the micrometer range.

The device basically comprises two layers L1 and L2. The first layer L1 comprises or consists of an electrically insulating material. The second layer L2 extends on the first layer L1 and comprises or consists of a non-electrically insulating material. The non-electrically insulating material of the second layer L2 may for example be an electrically conductive material (e.g., a metal or a doped semiconductor such as doped silicon) or a material that may potentially become electrically conductive, such as an undoped semiconductor, e.g., silicon (Si). In addition, the device 1 may typically comprise a lid L3 and a supporting substrate L0, as in embodiments discussed later.

Figure 1B:
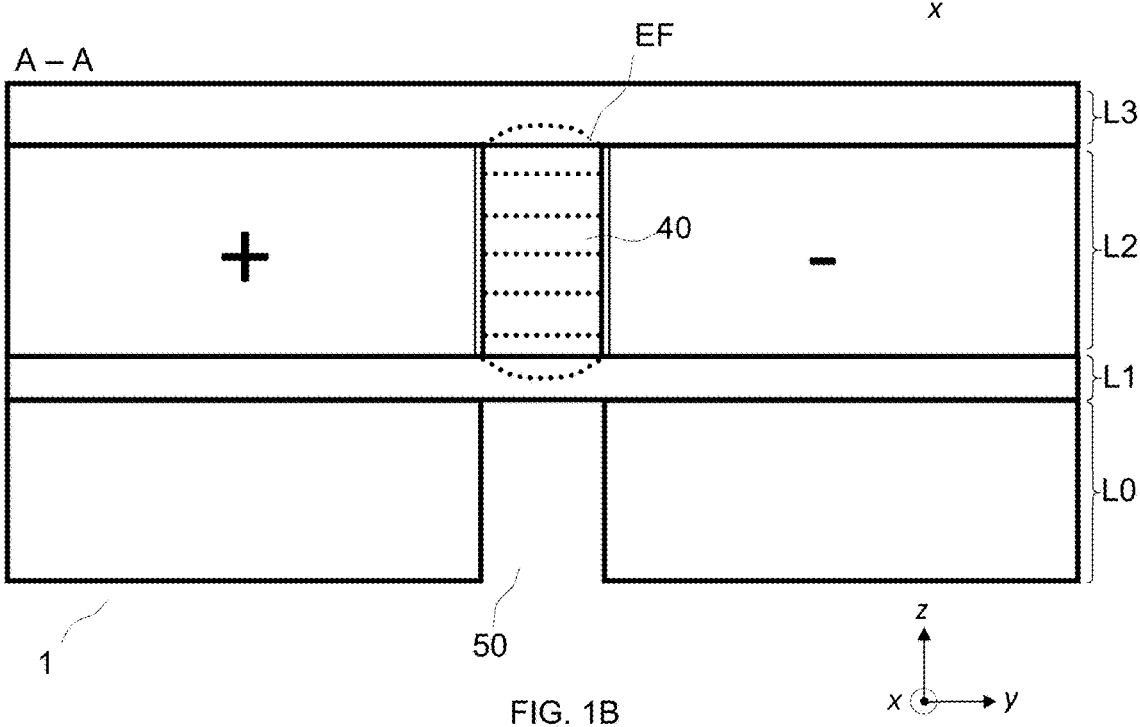

The second layer L2 is structured so as to define opposite, lateral walls of a microchannel 40, see, e.g., FIGS. 1A and 1B. A bottom wall of the microchannel 40 is defined by an exposed surface of the first layer L1 (the top surface of layer L1 in the accompanying drawings). Together with its bottom wall, the lateral walls define physical boundaries of the microchannel 40. Such boundaries may for instance draw a flow path for a liquid or a gas. At least a portion of this flow path may be straight, as assumed in FIGS. 1A-5C. However, the channel 40 may possibly have a more complex shape, as illustrated in FIGS. 6A and 7, and may further include additional structures or features (e.g., posts, mesas, capillary structures, filters, antennas) formed inside the channel.

The second layer L2 is further structured so as to incorporate one or more electrical insulation barriers 10, 20. Each of the electrical insulation barriers 10, 20 comprises a line of through holes 20. In each line, each through hole 20 is surrounded by an oxidized region 10 of the material of the second layer L2. This oxidized region can be regarded as forming oxidized shells, each surrounding a respective one of the holes 20. Thus, the through holes alternate with oxidized portions $10p$ of this oxidized region 10 along each line. The alternation of holes and oxidized portions along each line results in a respective, electrical insulation barrier.

Finally, each barrier extends, as a whole, laterally across the second layer L2, i.e., in the plane (y, z) in the accompanying drawings. However, given that the second layer L2 is an essentially planar object (notwithstanding possible structures therein), it mainly extends along the direction y in the accompanying drawings. That is, the line along which the holes 20 are aligned can be regarded as the main direction of the corresponding electrical insulation barrier.

Each electrical insulation barrier further extends up to one of the lateral walls of the microchannel 40. As a result, each electrical insulation barrier delimits two sections (in-plane)

of the second layer L2, i.e., on each side of the electrical insulation barrier but on a same side of the microchannel 40. As noted earlier, each electrical insulation barrier 10, 20 may extend along a straight line and thus be perpendicular to a lateral wall of the microchannel 40, as assumed in most of the accompanying drawings. In variants, one or more of the electrical insulation barriers may be shaped or otherwise meet a lateral wall at an angle that is less than 90°, so as to meet given design constraints due to, e.g., additional elements, structures, or channel bifurcations, as in FIG. 6.

Figure 4B:
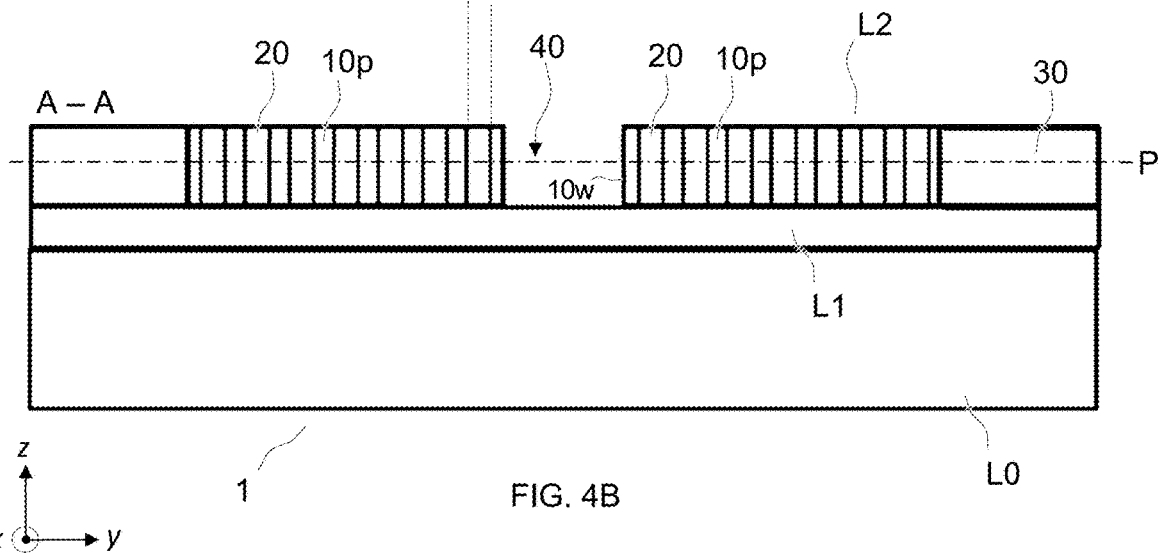
Figure 5A:
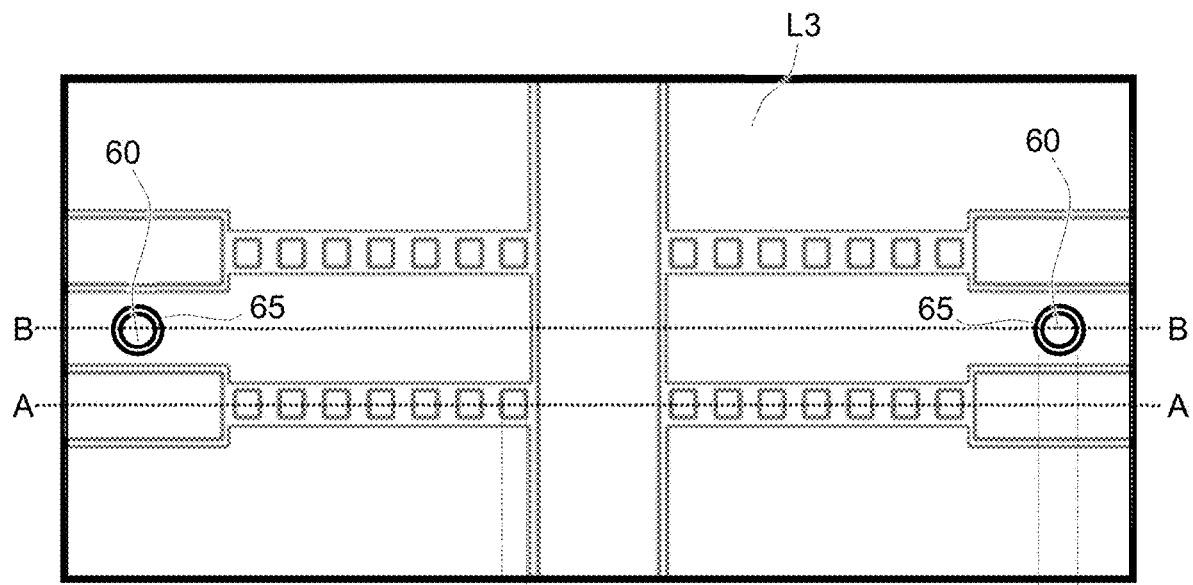
Figure 5B:
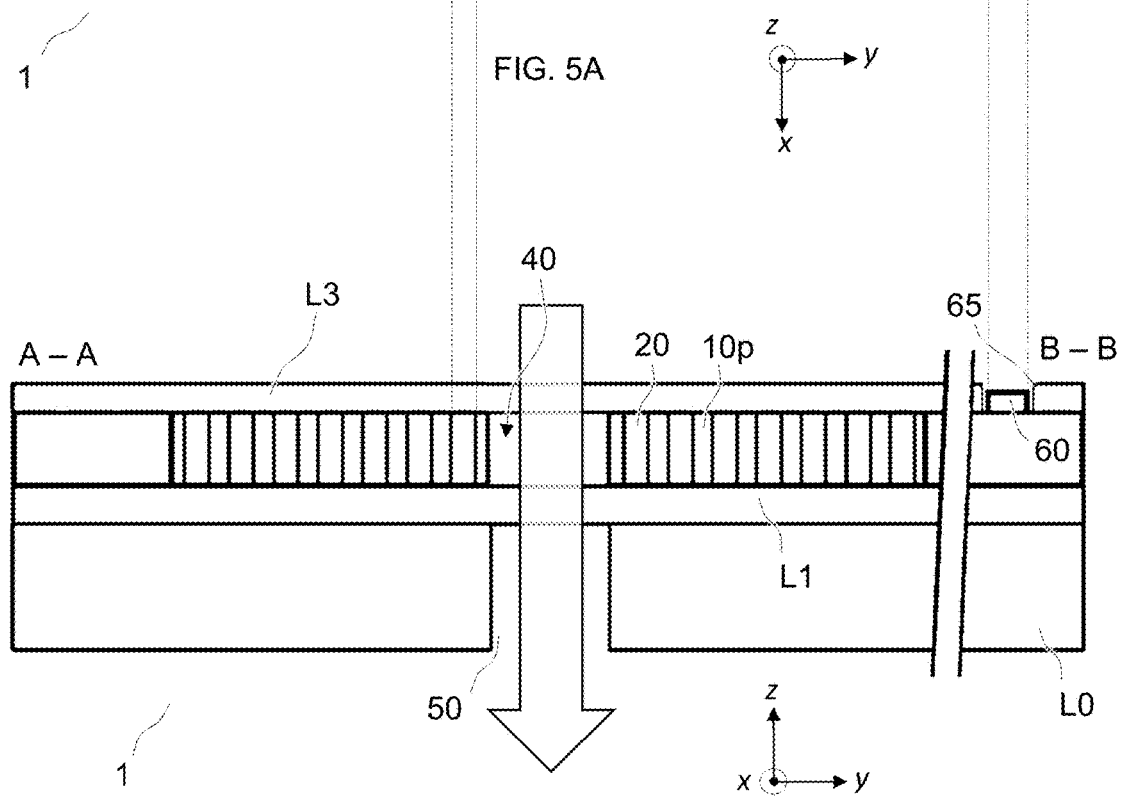

As for instance seen in FIG. 5B, the oxidized portions 10p extend, each, laterally across the second layer L2, i.e., in the plane (y, z) in the accompanying drawings, and seamlessly between any two neighboring through holes 20. The oxidized region 10 can be regarded as forming oxidized shells surrounding each of the through holes 20. The main direction of each electrical insulation barrier extends parallel to the average plane P of the second layer L2 (laterally, typically in plane with the layer L1), see FIG. 4B. However, each through hole 20 extends perpendicularly to this average plane P. I.e., each through hole extends perpendicularly to the second layer L2, from side to side. A through hole can be regarded as a perforation, e.g., having a cylindrical shape, a main axis of which extends perpendicularly to the second layer L2, that is, along the direction z in the accompanying drawings.

The surroundings (i.e., the oxidation shell) of the through holes 20 must be sufficiently oxidized and thick, so as for the oxidized portions 10p to seamlessly connect two contiguous holes 20. This, in turn, allows a barrier to be electrically insulating, as a whole. In other words, the oxidized portions 10p formed about each though holes 20 coalesce (both superficially and in cross-section) to form an insulating joint between each pair of adjacent holes 20. The alternation of such joints 10p and holes 20 forms an electrical insulation barrier. The oxide is preferably formed as a thermal oxide, as in preferred embodiments described later in reference to another aspect of the invention. Where a thermal oxidation process is used, a region of the material (e.g. Si) of the second layer L2 is converted into the oxidative species (e.g. $SiO_2$) of the original material.

Note, as a result of the preferred oxidation process proposed herein (exposed surfaces of layer L2 are thermally oxidized), each of the lateral walls 10w of the channel 40 may possibly be oxidized too, see, e.g., FIG. 1A. Having oxidized cannel walls is advantageous in two respects. First, this may favorably impact wetting properties of the surfaces of the channel. Second, the electrical insulation layer lowers the risk of shorts and eventually improves the electrical insulation and sealing of the device 1.

Owing to the proposed design, each electrical insulation barrier 10, 20 delimits two sections S1-S4; S5-S8 of the second layer L2 on a same side of the microchannel 40, see, e.g., FIG. 6. Any pair of neighboring sections are electrically insulated from each other, as a result of the electrical insulation barrier formed in-between. Thus, if the material of the second layer L2 is electrically conductive, as in embodiments, then the barrier prevents electrons from flowing from one section of the layer L2 to the other on a same lateral side of the channel 40. If, as in other embodiments, the layer L2 is not electrically conductive (without however being insulating), then the barrier still allows distinct electrical biases to be applied to each section.

In other words, the proposed approach allows entire sections Sk (see, e.g., FIG. 6) of the second layer L2 to act as electrodes. Insulated sections of the second layer L2 may accordingly be electrically biased to produce electric fields EF of arbitrary intensity (see FIG. 6, as well as the approximate electric field lines depicted in FIGS. 1A and 1B). This solution circumvents the need for patterning electrodes in or on the first layer L1 or the second layer L2; only the electrical insulation barriers need be patterned. In addition, the proposed solution is mechanically stable (more stable than barriers solely formed by trenches) and simple fabrication processes are proposed, which allow self-aligned electrode-channel structures to be obtained within a few processing steps only, instead of having to be aligned in sequential processing.

The depictions shown in FIGS. 1A-6 are simplified, to ease the exposition of the preferred embodiments of the invention. It is to be understood, however, that the present devices may possibly comprise several microchannels, including several channels as defined above as well as additional (regular) channels, e.g., to bring liquid or gas to or evacuate liquid or gas from the microchannel 40, and bifurcations 40, 40a (see, e.g., FIG. 6). In addition, the device 1 may possibly comprise one or more of: a vent, a liquid loading pad, capillary structures (e.g., anti-wetting structures), posts, mesas, a capillary and/or a membrane pump, flow resistors, an electric circuit, electrical contact pads, and analytical sites, as usual with microfluidic devices.

Note, "microfluidic" means that at least one dimension of a feature of the device 1 (i.e., a characteristic dimension of the channel 40) is at most in the micrometer range. Still, the device 1 may possibly be a nanofluidic (e.g., a nanogaseous device), having one or more characteristic dimensions that are less than 1 micrometer.

In embodiments, a characteristic depth of the present channels 40, chambers, vents and other structures (if any) is in the micrometer-length range, i.e., between 1 μm and 200 μm, or less. Yet, some particular structures of the present devices may be in the nanoscale range or in the millimeter range, the device 1 as a whole typically being in the centimeter range. Widths of the channels (e.g., as measured in-plane) may typically be in the micrometer-length range too, or less. The channel width is measured in-plane and perpendicularly to the direction of propagation of the fluid in that channel, i.e., parallel to the average plane P of layer L2.

The layers L1, L2 are preferably supported by a substrate (L0), or the layer stack otherwise includes a layer that is sufficiently thick to provide mechanical stability to the device. Preferably though, mechanical stability is provided by means of a substrate, i.e., an underlying layer L0, typically an essentially planar object, such as a chip, a wafer or any such planar support. The microchannel structure is typically covered (hermetically sealed) by a light-permissive layer L3, for detection/monitoring purposes, as discussed later in detail.

All this is now described in detail, in reference to particular embodiments of the invention. To start with, several electrical insulation barrier designs can be contemplated. For instance, the electrical insulation barriers 10, 20 may solely consist of alternating through holes 20 and oxidized portions 10p. In preferred embodiments, however, the second layer L2 may be structured so as to define one or more spatial separators 30, see, e.g., FIG. 1A. Each spatial separator 30 is defined as a cavity that extends perpendicularly to the average plane P of the second layer L2, from side to side. That is, each spatial separator 30 is formed as an empty cavity, which extends from one side of the layer L2 to the opposite side. Such cavities 30 normally have larger lateral in-plane dimensions than the through holes 20 that form part of the electrical insulation barriers. Note, surroundings of such cavities will likely be oxidized too, see FIG. 1A, as per the preferred oxidation processes used to oxidize the through holes 20. However, contrary to the through holes 20, whether the separators 30 are oxidized or not is not critical, inasmuch as electrical insulation is achieved thanks to air gaps formed by the cavities 30. And as seen in FIG. 1A, each electrical insulation barrier 10, 20 extends, as a whole, laterally across the second layer L2 from a respective spatial separator 30 up to a lateral wall 10w of the channel 40. Thus, in such embodiments, the separators 30 may be regarded as forming part of the electrical insulation barriers, extending the length of through hole-based electrical insulation barriers from the microchannel. Providing reasonably long spatial separators 30 does not compromise the mechanical stability of the device (most of the electrical insulation barrier is still formed by the alternating holes 20 and portions 10p) and allows the lines of alternating through holes 20 and portions 10p to be shortened, which eases the fabrication process. Mechanical stability is otherwise ensured by non-patterned sections of layer L2, e.g., which come in contact with the anodically bonded lid L3.

In embodiments, the second layer L2 is structured so as to define at least two electrical insulation barriers 10, 20, these including one electrical insulation barrier on each lateral side of the microchannel 40. Each of the two electrical insulation barriers 10, 20 extends laterally across the second layer L2 up to a respective one of the lateral walls of the microchannel 40 in that case.

Besides, the second layer L2 may possibly be structured to define two electrical insulation barriers 10, 20, or more, on a same side of the microchannel 40. In that case, each of the two electrical insulation barriers 10, 20 extends laterally across the second layer L2 up to the same lateral wall of the microchannel 40. Two electrical insulation barriers 10, 20 on a same side of the microchannel 40 delimit three sections of the second layer L2 on that same side of the microchannel, wherein the middle section is electrically insulated with respect to the outer sections.

In the example, of FIGS. 1A and 1B, two electrical insulation barriers are formed on each side of the microchannel 40, i.e., each side has two electrical insulation barriers. The two middle sections on the opposite sides of the microchannel 40 can thus be electrically biased with respect to each other (with, e.g., one section grounded, while the opposite section is biased to an arbitrary voltage), which results in an electric field EF across the microchannel 40 as schematically depicted by dotted lines in FIGS. 1A and 1B. Note, very uniform electric fields (in terms of strength) can be achieved across the microchannel 40

More generally, the second layer L2 may be structured so as to define a set of one, two, or more, electrical insulation barriers 10, 20, on one or each lateral side of the microchannel 40, where each barrier extends laterally across the second layer L2 and up to a respective one of the lateral walls of the channel 40.

In terms of materials, the first layer L1 may for example comprise a material that is an oxide of the material of the second layer L2. In that respect, the material of the second layer L2 preferably comprises silicon, in which case the material of the first layer L1 may for instance comprise silicon dioxide. Note, the material of the second layer L2 may possibly comprise or consists of doped silicon, as is the case when using ionic implantation into Si to tune the conductance of the second layer L2. Of course, other semiconductor materials and oxidized species thereof can be contemplated too.

In embodiments, the first layer L1 is a buried oxide layer. As depicted in FIGS. 1A, 1B, and 5, the device 1 preferably comprises a handle wafer L0, over which extends the buried oxide layer L1. E.g., the first layer L1 and the second layer L2 may be provided as a silicon-insulator-silicon structure, wherein the first layer L1 is a buried oxide layer, comprising silicon dioxide, and the first layer L1 (silicon) extends on a silicon wafer handle L0, as discussed later in reference to preferred fabrication methods.

Moreover, the handle wafer L0 may be structured so as to comprise an opening 50 extending opposite (i.e., vis-à-vis) the bottom wall of the microchannel 40. In this example, the opening 50 defines an optical window across the microchannel device 1, together the microchannel 40 and the buried oxide layer L1, the latter assumed to be permissive to light. The opening 50 may typically have substantially the same width as the bottom wall of the channel 40. In practice, however, the opening 50 is preferably made slightly larger than the width of the microchannel 40 as the lithographic step to open the handle wafer has a typical alignment accuracy (backside wafer alignment) larger (typically 2-5 μm) than the width of the microchannel 40 itself.

At present, preferred dimensions of the components of the microfluidic device 1 are discussed in detail. In embodiments, the average diameter of the through holes 20 is between 100 nanometers and 5 micrometers. The diameter is measured parallel to the average plane P of the second layer L2. In practice, the diameter depends on the thickness of the second layer L2 and the anisotropic etching parameters that can be achieved during the fabrication process.

Preferably, the average gap between contiguous through holes 20 in each line is between 100 nanometers and 4 micrometers. The gap is measured parallel to the average plane P of the second layer L2 from the center of each through hole 20 to the adjacent one. Note, the optimal spacing between the through holes is determined by the oxidation process used (mostly a self-limiting process), which limits the maximal gap Oxidation thicknesses of more than 2 micrometers are difficult to achieve and/or take a prohibitively long time to complete in practice.

In embodiments, the average thickness of the first layer L1 is between 50 nanometers and 5 micrometers, while the average thickness of the second layer L2 is between 5 nanometers and 5 micrometers, depending on the desired application. Imposing a small thickness (e.g., close to 5 nanometers) may be desired for gas microfluidics, for example. The thicknesses are measured perpendicularly to the average plane P of the second layer L2.

Aspects related to the (optional) lid L3 are now discussed. As noted earlier, in embodiments, the microfluidic device 1 further comprises a lid L3, which extends on the second layer L2, opposite the first layer L1 with respect to the second layer L2. The lid L3 physically closes the microchannel 40 and seals the device from the top. The lid L3 is electrically non-conductive and is preferably sufficiently permissive to light (e.g., transparent), so as to enable optical characterization experiments in transmission via the optical opening 50, as schematically illustrated in FIG. 5B. The lid L3 is preferably a glass layer (e.g., quartz or fused silica), bonded (e.g., anodically) on the second layer L2.

As further illustrated in FIGS. 5A and 5B, the device 1 may additionally comprise one or more electrical contact pads 60 in electrical contact with respective sections of the second layer L2. In that case, the lid L3 may advantageously comprise one or more apertures 65 for the respective electrical contact pads 60, which can accordingly be contacted by electrode needles, spring-loaded contacts, etc. That is, each aperture 65 is designed so as for a respective contact pad 60 to be accessible from outside the device 1. In practice, contact pads 60 and corresponding apertures 65 are provided for each section of layer L2 that need be biased, electrically.

Referring to FIGS. 2A-5C and 7, another aspect of the invention is now described in detail, which concerns a method of fabrication of a microfluidic device 1 such as described above.

The method requires S10 a first layer L1 of an electrically insulating material and a second layer L2 of a non-electrically insulating material. As noted earlier, the first layer L1 and the second layer L2 provided S10 preferably form part of a silicon-insulator-silicon structure. In that case, the material of the second layer L2 comprises silicon, the material of the first layer L1 provided is a buried oxide layer, comprising silicon dioxide, and the first layer L1 extends on a silicon wafer handle L0.

Figure 2A:
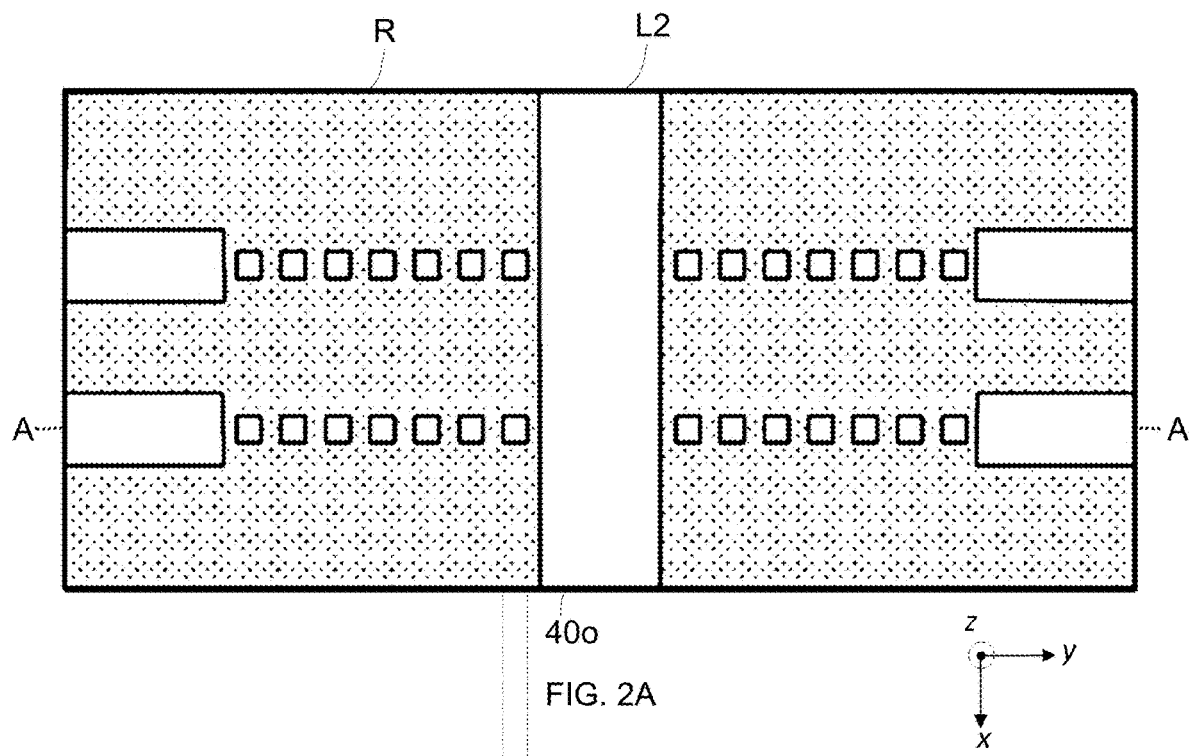
FIGS. 2A, 2B, 3A, 3B, 4A, 4B, 5A, 5B, and 5C illustrate fabrication steps of such a microfluidic device, as in preferred embodiments.
Figure 2B:
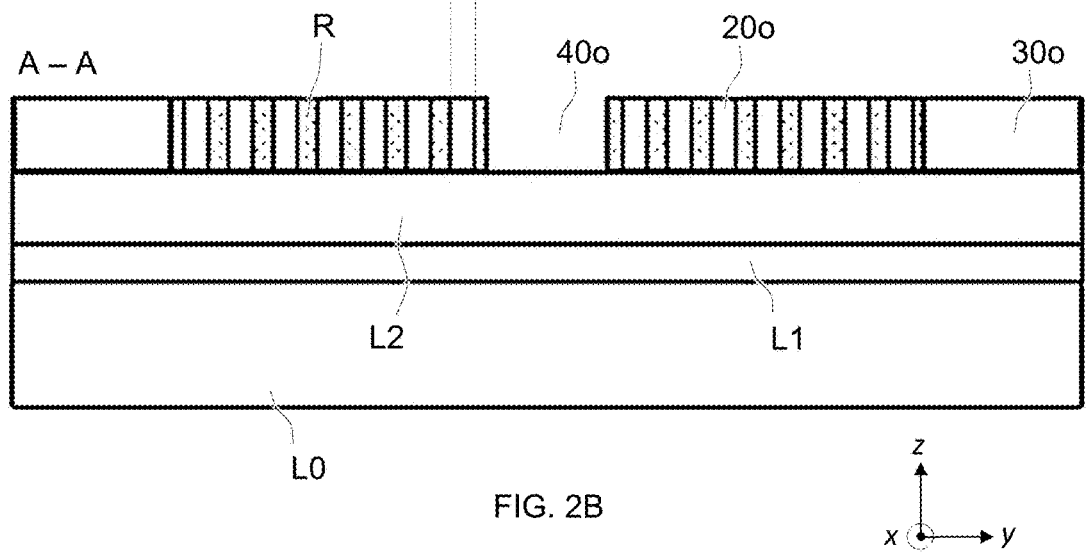

Next, a lithographic resist R is patterned S20 on top of the second layer L2, so as for the resist R to define apertures 20o, 40o, see FIGS. 2A and 2B. The aperture 40o correspond to the microchannel 40 to be eventually obtained, while the apertures 20o are openings that are aligned along one or more lines. Each line extends laterally across the second layer L2 toward the aperture 40o.

Figure 3A:
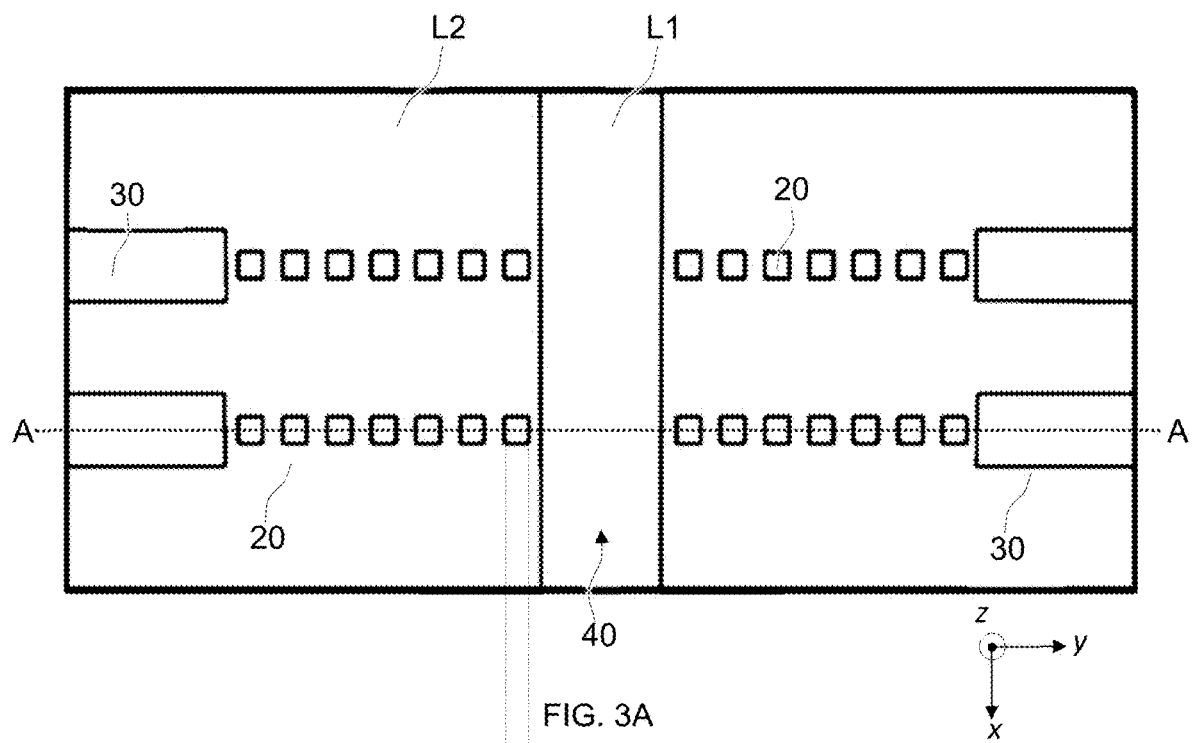
Figure 3B:
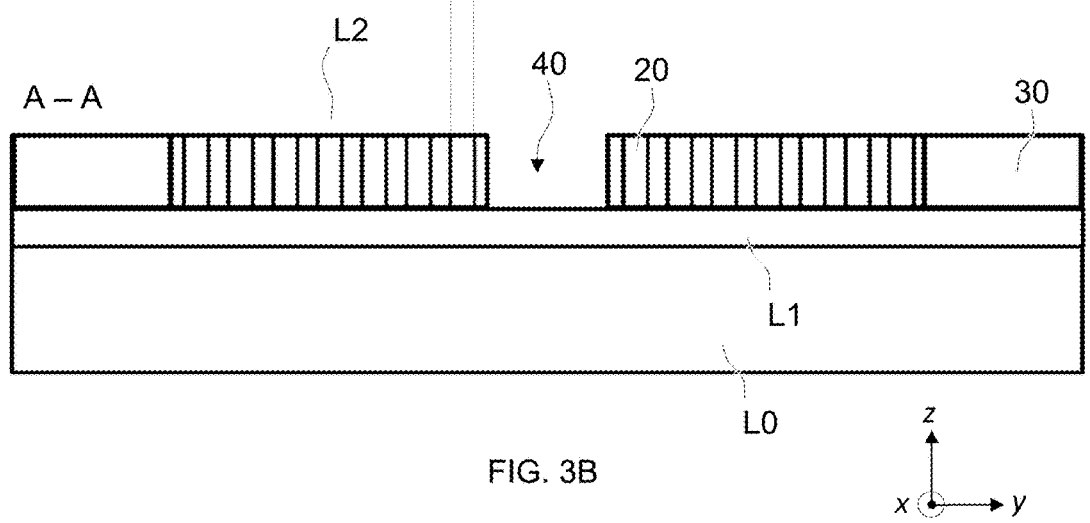

Portions of the second layer L2 are subsequently etched S30 (e.g., using a deep reactive ion etching process) in accordance with the apertures 20o, 40o, as illustrated in FIGS. 3A, 3B. The lithographic resist R is used as a mask to protect residual portions of the second layer L2. This results in structuring the second layer L2, see FIG. 3B. Owing to the previously patterned lithographic resist R, the etch step causes to obtain opposite, lateral walls of the microchannel 40; its bottom wall is defined by the exposed surface of the first layer L1, as explained earlier. In addition, the etch step results in one or more lines of through holes 20 corresponding to the openings 20o, respectively.

Finally, the exposed surfaces of the second layer L2 are thermally oxidized S50 to obtain one or more electrical insulation barriers 10, 20. As explained earlier, each barrier 10, 20 is formed as a line of through holes 20, each surrounded by the oxidized region 10 of the material of the second layer L2. Owing to the above fabrication method, the through holes 20 alternate with oxidized portions 10p of this region 10 along a respective line, and each barrier extends, as a whole, laterally across the second layer L2 up to one of the lateral walls. As a result, each barrier delimits two sections of the second layer L2 on a same side of the microchannel 40.

Note, the resist R is preferably stripped S40 and the wafer cleaned S40 prior to thermally oxidizing S50 the second layer L2. Incidentally, the lateral patterning of electrodes (i.e., along the microchannel) can be made much smaller than is currently possible; the pitch is only limited by the electrical insulation barrier(s). This makes it possible to obtain a sequence of electrodes on a same side of the microchannel 40, which is notably beneficial for applications involving picoinjection.

Preferably, the present methods further comprise patterning S60 one or more electrical contact pads 60. Such pads must electrically contact respective sections of the second layer L2, see FIGS. 5A and 5B. The contact pads 60 can be obtained by lithographic patterning and evaporation to deposit metal. A removal of the thermal oxide may further be required prior to deposition, in order to improve the electrical contact, which can be done via buffered hydrofluoric acid (BHF) etching but requires the oxide portions to be protected by a resist. In variants, electrical contacts may be provided on lateral sides of the corresponding layer portions, or such portions may be directly contacted by suitable conductors.

In embodiments, the present methods further comprise etching S70 an opening 50 in the silicon wafer handle L0. This is done so as for the window 50 to extend opposite the bottom wall of the microchannel 40, which eventually eases optical characterization experiments, as explained earlier.

In embodiments, the present methods further comprise bonding S80 a lid L3 (e.g., a cover glass) to the second layer L2, to close and seal the device 1, see FIGS. 5A and 5B. Anodic bonding may notably be used, especially to bond glass on silicon. Again, one may want to remove the residual oxide layer on top of second layer L2 prior to bonding the lid L3, though this is not strictly necessary in practice, owing to the thin residual oxide layer obtained as per the above process. Suitable apertures 65 may need be formed S80 in the lid L3, prior to attach it, as discussed in section 2. In variants, a polymer layer (thin film) may be laminated on top of layer L2.

The above embodiments have been succinctly described in reference to the accompanying drawings and may accommodate a number of variants. Several combinations of the above features may be contemplated. Examples are given in the next section.

2. Specific Embodiments—Technical Implementation Details

This section discloses how wall segments along microchannels can be electrified while simultaneously structuring silicon-based channels, using simple fabrication steps. Upon thermal oxidation, electrical segments along the channels are electrically insulated from each other. The fabrication process proposed further allows leak-free fluid or gas conditions to be maintained. As the channel's lateral walls are electrified without requiring any additional insulating layer separating the biased material section from the channel, ideal electrostatic conditions can be achieved, e.g., to produce high-field intensities and/or high-gradient fields. The proposed approach opens new pathways for gas and fluid handling at drastically reduced voltages and higher field gradients, with a fabrication process that is mass-fabrication compatible and allows upscaling to very large-area wafers.

2.1 General Aspects of the Preferred Fabrication Methods and Devices

Microchannels are generally made from PDMS. In contrast, the present approach relies on semiconductor materials to structure the microchannels, which provides a variety of benefits at an acceptable fabrication overhead. Such benefits include:
  Mechanical compliance under pressure, e.g., a high rigidity for a non-pulsing channel under operation;
  Chemical inertness allowing, e.g., usage of corrosive gases and solvents/liquids;
  Leak-free channels, e.g., no penetration of oxygen through the channels as in prior PDMS-based devices;
  Micro- and nanostructuring capabilities;
  Anodic bonding of silicon or glass covers to close structures, allowing higher operational pressures;
  Optical access via optical transmission windows; and
  Integration of optical, electrical, and electrochemical features.
Silicon-on-insulator (SOI) substrates are preferably used. The microchannels are structured on the device layer, and the buried oxide (BOX) layer electrically isolates the two opposing channel walls. A set of perforations 20 structured between adjacent electrodes allows electrical isolation in-plane of the device layer L2 and between adjacent electrodes without compromising the integrity of the channel walls. Note, in the present approach, an "electrode" refers to an electrically insulated portion of the device layer, wherein the device layer further defines the side walls of the microchannel(s). The perforations 20 are patterned in the same step as the channel(s), thus eliminating alignment issues and allowing arbitrary placement of the electrodes. To electrically insulate the electrodes, the silicon material portions between the perforations are converted to silicon oxide 10 via thermal oxidation, resulting in a set of silicon oxide bulkheads 10p. In addition, an optical view port 50 can be opened in the handle wafer layer L0 to allow optical transmission through the microchannel 40. Electrical contact pads 60 are fabricated on top of the device layer to electrically address the patterned electrodes.

The above-mentioned steps advantageously allow CMOS materials and CMOS fabrication technology to be used. The components and processes are described in the following.

2.2 Components

The following components are preferably involved, see FIGS. 1A and 1B:
- A handle wafer L0 to mechanically support structures fabricated on top;
- A device layer L2, e.g., made from silicon (either pristine or doped in selected areas to tune its conductance);
- A BOX layer L1 separating electrically and spatially the device layer L2 from the handle wafer L0;
- A microchannel 40 structured into the device layer L2, a bottom wall of which is defined by an exposed surface of the BOX layer L1;
- Two or more electrical insulation barriers 10, 20, which allow separate segments of layer L2 to be electrically biased, insulated from the rest of the device layer L2 by the electrical insulation barriers according to a desired geometry; and
- An optical view port/opening 50 in the handle wafer for optical transmission measurements;
- A lid (also referred to as a cover herein) L3 to close the microchannel(s).

The handle wafer, BOX, and device layer are usually fabricated in a fabrication process to form SOI wafers, e.g., by implantation-induced cracking, bonding, etc., as known per se.

Each electrical insulation barrier preferably comprises the following components (as best seen in FIG. 1B):
- Aligned through holes 20 (also referred to as perforations herein) in the device layer L2;
- A thermal oxide 10 surrounding the through holes 20; and
- A spatial separator 30 creating an airgap insulation in a region further apart from the microchannel 40;

2.3 Preferred Fabrication Process

Figure 4A:
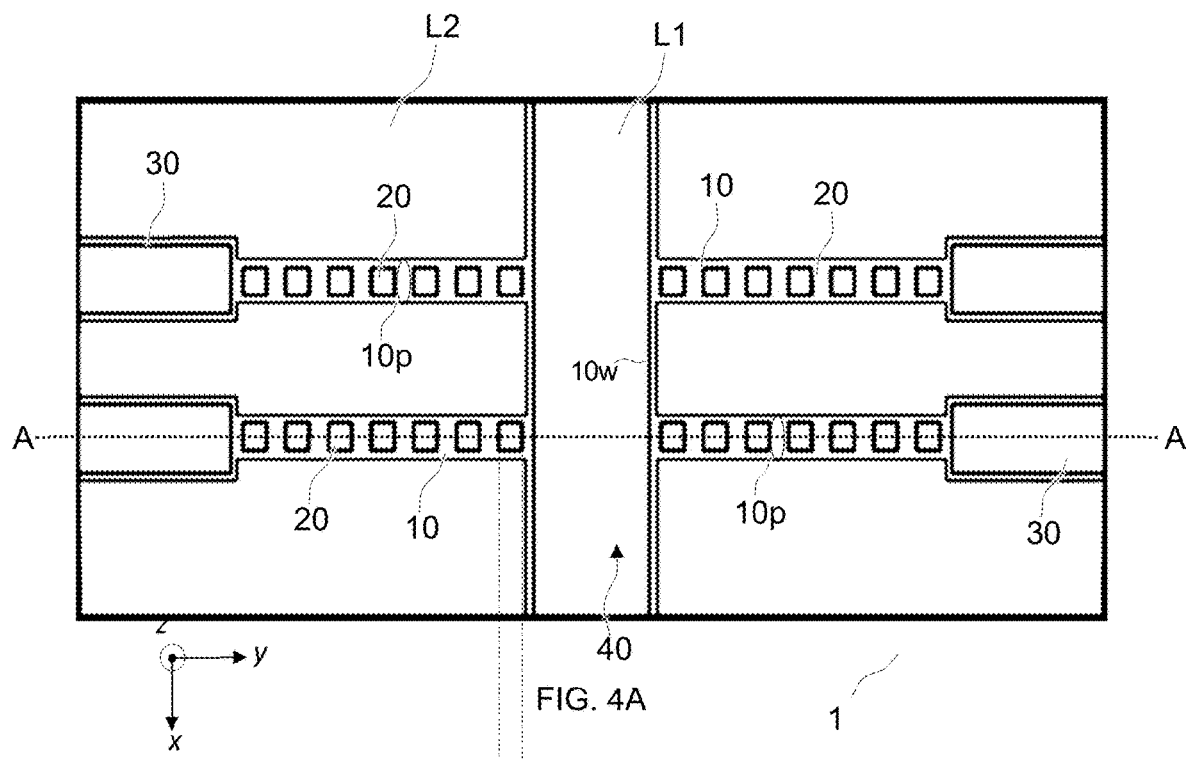
Figure 5C:
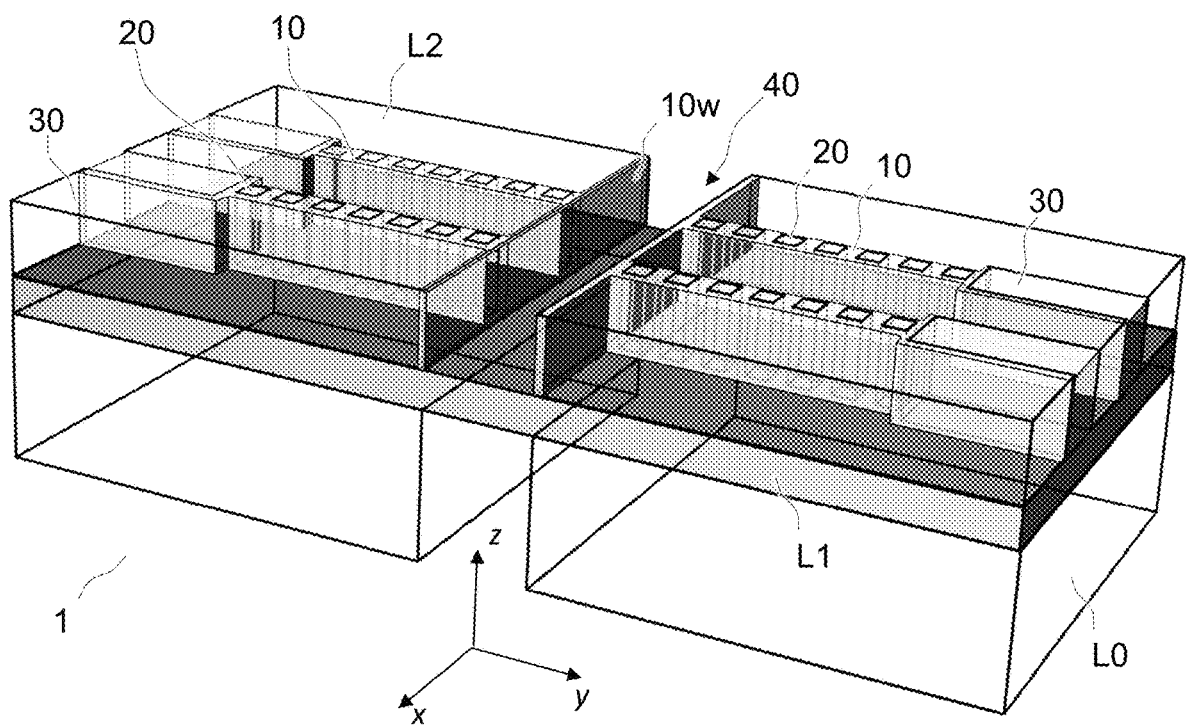

A fabrication process is schematically depicted in FIGS. 2A-5C, which illustrate steps of: structuring and insulating electrodes by patterning the device layer (FIGS. 2A and 2B), pattern transfer via deep reactive-ion etching (DRIE), see FIGS. 3A and 3B, and thermal oxidation to isolate the segments (FIGS. 4A and 4B). Additional features such as contact pads, transmission windows, and cover are subsequently fabricated (FIGS. 5A and 5B). See also the flow shown in FIG. 7.

2.3.1. Channel and Electrode Patterning

First, an ultraviolet (UV) lithography or electron-beam lithography (EBL) compatible resist is spin-coated.

The resist is then structured S20 by exposing it either to UV photons or electrons (depending on the resolution to be achieved) and is subsequently developed in order to create open structures for both the channel 40, the perforation patterns 20, and the spatial insulators 30 in a generic layout such as depicted in FIGS. 2A and 2B. Note, the layouts used to obtain the different insulation barriers need not necessarily be all identical.

2.3.2. Channel and Insulation Fabrication

The lithography resist is subsequently used as a mask to protect the device layer upon etching S30 by DRIE. This step transfers open structures (apertures) corresponding to the channel(s), the perforation pattern, and the spatial insulators into the device layer L2 in a self-aligned, single step (FIGS. 3A and 3B).

Next, the residual lithography resist is stripped S40 and the wafer is cleaned S40 in view of further processing.

2.3.3. Thermal Oxidation

Finally, the entire SOI wafer is thermally oxidized S50 (FIGS. 4A and 4B). In this process, a certain volume of Si is converted from Si to $SiO_2$ with the oxidation growing from the surfaces exposed to the gaseous oxidant.

Note, the duration of the oxidation process is adjusted so that the Si material portions between contiguous perforations 20 are entirely converted to $SiO_2$. The conversion depends on various parameters of the underlying chemical process used, as well as on geometries and mass-flow access. Typically, approximately 46 percent of the volume of the Si material is converted on the planar, non-patterned surfaces into $SiO_2$.

Eventually, the combination of perforation patterns and oxide surrounding (shells) results in electrical insulation barriers, which, in turn, allows electrode portions of the device layer L2 to be spatially separated and electrically insulated from other portions (including the bulk) of the Si device layer.

2.3.4. Fabrication of the Contact Pad(s) and Optical Transmission Window, and Cover Glass Bonding The above fabrication method involves generic, individual fabrication steps, which can be incorporated in various fabrication process flows. Additional features can further be achieved, as now described in reference to FIGS. 5A, 5B, and 7:
- Contact pads 60 for direct electrical contact, e.g., via prober needles or spring-loaded contacts, can be fabricated S60 by embedding the entire structure 1 into a photoresist and spin-coating the resist on top of the SOI surfaces, and then creating openings by UV lithography. This mask allows the thermal oxide to be removed site-selectively only at the interface to the electrically separated region in Layer L2 by a BHF dip prior to metallization of the pads and subsequent lift-off process;

Optical transmission windows 50, e.g., for optical readout in fluorescence-based sorting processes, can be fabricated S70 thanks to a back-side alignment and by masking the wafer from both sides (top side and handle wafer side), using a photoresist. The opening 50 is lithographically structured by UV lithography and developed accordingly. This window allows DRIE of the handle wafer with a selective stop at the BOX; and Cover glass attachment, e.g., for closing the microchannel(s) 40, is done S80 by bonding a cover glass L3 to the device layer L2 (e.g., by anodic bonding of a borofloat 33 glass) (FIG. 5B). This may possibly require a selective removal of the thermal oxide grown on the top device layer, prior to bonding, e.g., to create an anodic bond between the borofloat 33 glass and the charges in the device layer. Suitable apertures 65 are provided at locations corresponding to the pads 60, to allow the latter to be accessed from outside the device 1.

Figure 6:
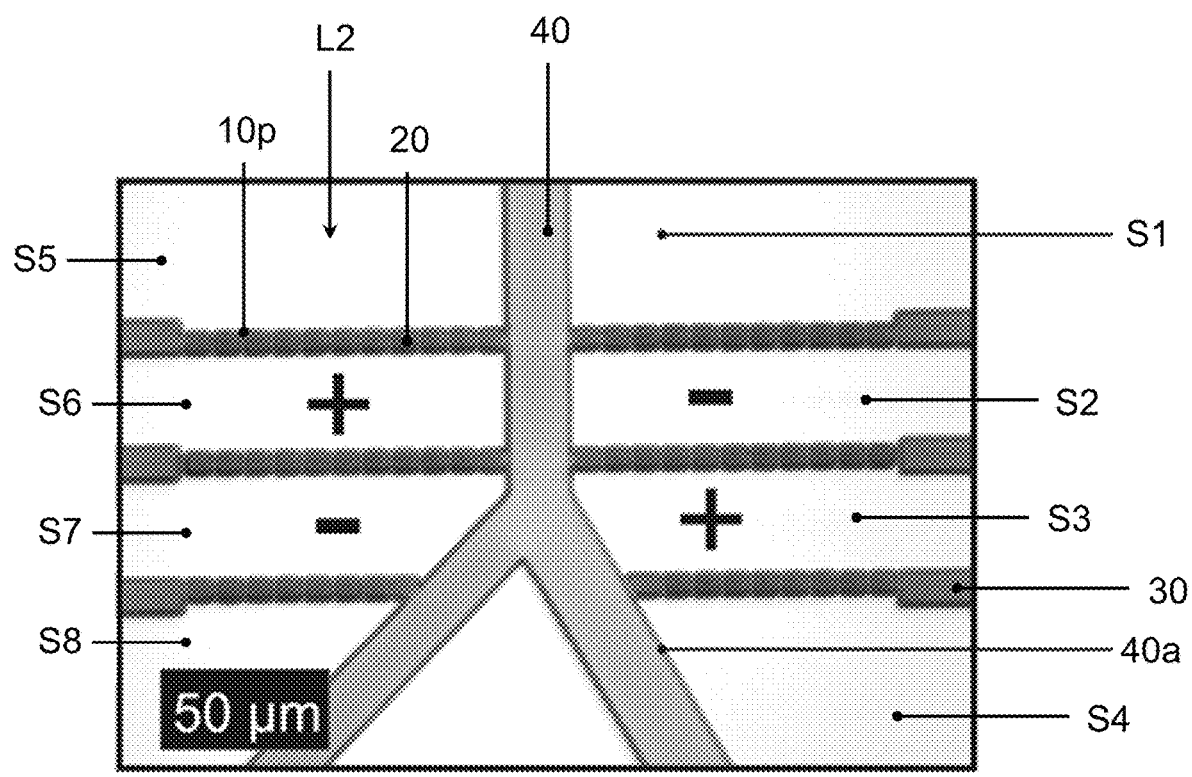
FIG. 6 is a scanning electron microscope (SEM) image showing a top view of a microfluidic device with two pairs of electrodes implemented directly in the side walls of microchannels forming a Y-type junction, according to embodiments.
Figure 7:
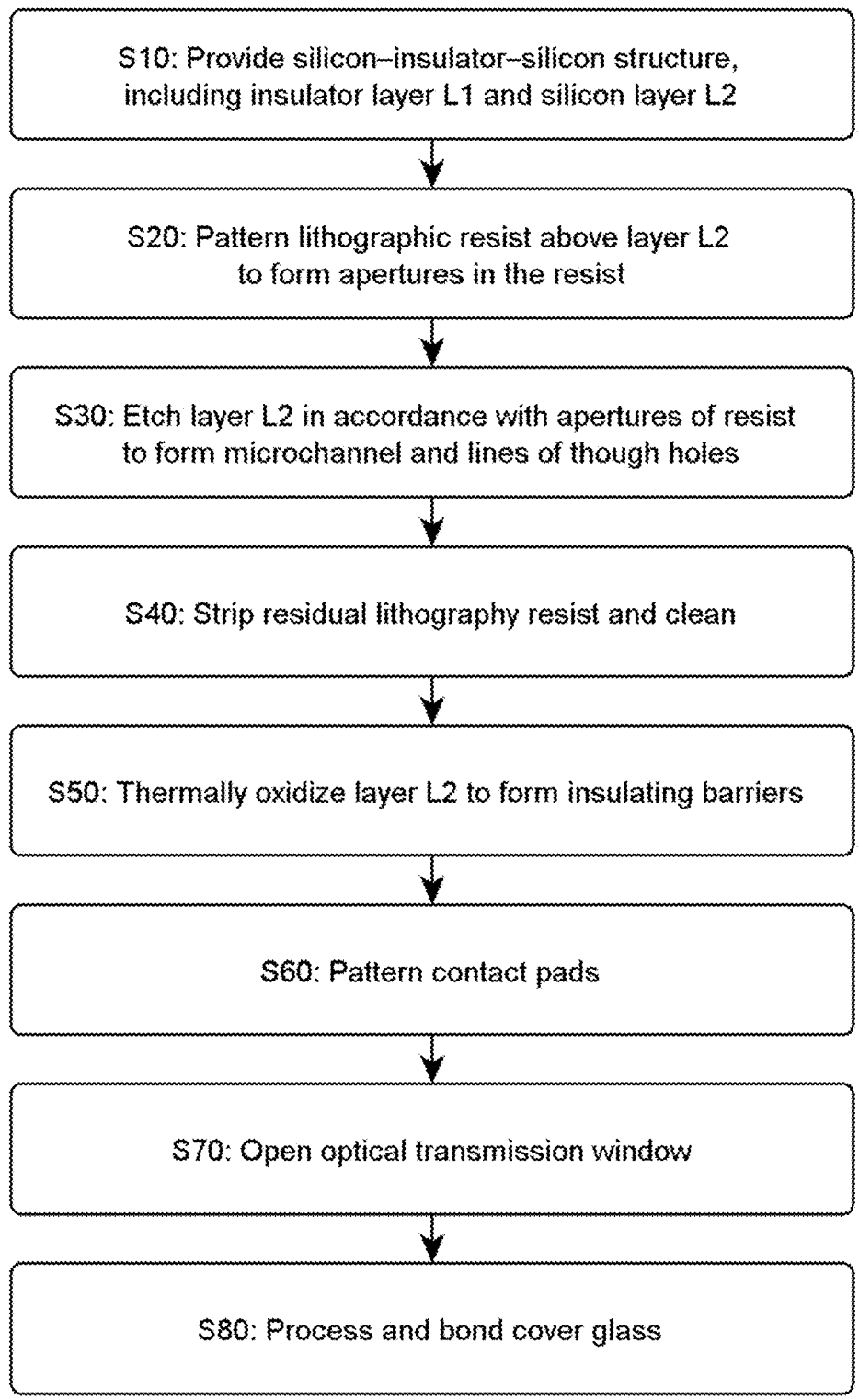
FIG. 7 is a flowchart illustrating high-level steps of a fabrication method of a device according to preferred embodiments.

FIG. 6 shows an example of two pairs of electrodes self-aligned to a microchannel, as obtained after oxidation. The oxide is visible in the scanning electron microscope (SEM) image as dark grey lines around the perforation pattern (through holes), the spatial separators (cavities), and the microchannel.

2.4 Comments

PDMS-fabricated electrodes are mostly composed of metals, which, inherently, have a high conductivity. On the contrary, electrode structures obtained from semiconductor materials such as, e.g., intrinsic/undoped silicon, do not inherently have a high conductivity as silicon is a semiconductor. However, the device layer of SOI wafers can be made highly conductive by locally doping segments of the semiconductor material with dopants (e.g., by ion implantation and subsequent activation/recrystallization with a rapid-thermal annealer). Sufficiently high charge-carrier concentrations can accordingly be achieved. For many applications, however, only (high) electrical fields are required, without it being needed to have highly conductive electrodes. For that purpose, intrinsic Si device layers are sufficient and do not require ion implantation, thus simplifying the processing. In the present fabrication process, the thermal oxidation process normally gives rise to an oxide layer that also covers the lateral walls of the microchannel, which can advantageously be used to protect the microchannel walls. This oxide layer can be removed, if desired, or left in place to prevent direct contact of the medium present in the microchannel and the bias electrodes.

The above fabrication process makes it possible to leverage entire segments (also referred to as sections) of the device layer L2 that otherwise defines side walls of the microfabricated channel(s) and, this, directly as in-plane electrodes. The main advantages obtained are the homogeneity of the electric field over the whole cross-sectional volume of the channel, the ability to reduce the electrode separation in the extent permitted by the width of the channel (leading to reduced voltage requirements), and high-field gradients that can be generated by longitudinally arranged, nearby electrodes. In addition, the self-aligned placement of the electrodes in the system (as they are created during the same structuring step as the microchannel) allows a high accuracy in the resulting geometry and a long-term stability and reliability as required for high-field operation.

The fabrication process steps involved can easily be implemented and applied to a variety of patterning tasks. A preferred arrangement is one where electrodes are arranged close to a microchannel in a transversal, in-plane configuration.

2.5 Applications

Given the large range of possible electrode implementations and electric-field functionalities that may benefit from or are enabled by a more accurate and narrower arrangement of electrodes, a variety of applications can be contemplated, including:

Deflection, e.g., based on different charge polarities or charging states;

Separation, e.g., into multiple channels/type of entities;

Micro- and pico-injection, e.g., based on polarizable membranes;

Electroporation, e.g., based on charged or neutral, and possibly polarizable species;

Electrochemistry, e.g., based on electrical-field driven reactions;

Oriented field-driven reactions, e.g., based on stereoselectivity induced by field polarities;

Electric-field enhanced analytics, e.g., surface-enhanced Raman spectroscopy; and Electrogenetics, e.g., based on polarizable channels in cells membranes or polarization dependent or electric-field sensitive cell-intrinsic processes; and Entities to be used for the above-mentioned tasks include molecules, clusters of molecules, proteins, cells, vesicles, particles, soft matter compartments, etc.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other semiconductor materials than those explicitly mentioned may be contemplated.

What is claimed is:

1. A microfluidic device comprising:
a first layer of an electrically insulating material; and
a second layer of a non-electrically insulating material extending on the first layer, wherein the second layer is structured so as to define:
opposite, lateral walls of a microchannel, a bottom wall of which is defined by an exposed surface of the first layer, thereby defining physical boundaries of the microchannel; and
one or more electrical insulation barriers, wherein each barrier of the one or more electrical insulation barriers comprises a line of through holes, each surrounded by an oxidized region of the material of the second layer, whereby the through holes alternate with oxidized portions of said oxidized region along the line; and extends, as a whole, laterally across the second layer up to one of the lateral walls, thereby delimiting two sections of the second layer on a same side of the microchannel.

2. The microfluidic device according to claim 1, wherein each of said lateral walls is oxidized.

3. The microfluidic device according to claim 1, wherein:
the second layer is structured so as to define one or more spatial separators, each defined as a cavity that extends perpendicularly to an average plane of the second layer, from side to side; and
said each barrier extends, as a whole, laterally across the second layer from a respective one of the spatial separators up to said one of the lateral walls.

4. The microfluidic device according to claim 1, wherein the second layer is structured so as to define two of said electrical insulation barriers, including one electrical insulation barrier on each lateral side of the microchannel, whereby each of the two of said electrical insulation barriers extends laterally across the second layer up to a respective one of the lateral walls of the microchannel.

5. The microfluidic device according to claim 1, wherein:
the second layer is structured so as to define two of said electrical insulation barriers on a same side of the microchannel, whereby each of the two of said electrical insulation barriers extends laterally across the second layer up to a same one of the lateral walls of the microchannel.

6. The microfluidic device according to claim 1, wherein the material of the second layer comprises silicon and the material of the first layer comprises silicon dioxide.

7. The microfluidic device according to claim 6, wherein the material of the second layer comprises doped silicon.

8. The microfluidic device according to claim 6, wherein the first layer is a buried oxide layer.

9. The microfluidic device according to claim 8, wherein the device further comprises a handle wafer, over which extends the buried oxide layer; and
the handle wafer comprises an opening extending opposite the bottom wall of the microchannel, the opening defining an optical window across the microchannel device, together the microchannel and the buried oxide layer, the latter being permissive to light.

10. The microfluidic device according to claim 1, wherein an average diameter of the through holes is between 100 nanometers and 5 micrometers, the average diameter measured parallel to an average plane of the second layer.

11. The microfluidic device according to claim 1, wherein an average gap between contiguous ones of the through holes along said line is between 100 nanometers and 4 micrometers, the average gap measured parallel to an average plane of the second layer.

12. The microfluidic device according to claim 1, wherein an average thickness of the first layer is between 50 nanometers and 5 micrometers, while an average thickness of the second layer is between 5 nanometers and 5 micrometers, each average thickness measured perpendicularly to an average plane of the second layer.

13. The microfluidic device according to claim 1, wherein the device further comprises an electrically non-conductive lid extending on the second layer, opposite the first layer with respect to the second layer, so as to close the microchannel.

14. The microfluidic device according to claim 13, wherein
the device further comprises at least one electrical contact pad in electrical contact with one of said two sections, and the lid comprises at least one aperture arranged so as for the at least one electrical contact pad, respectively, to be accessible from outside the device.

15. A method of fabricating a microfluidic device, the method comprising:
providing a first layer of an electrically insulating material and a second layer of a non-electrically insulating material, the second layer extending on the first layer;
patterning a lithographic resist on top of the second layer, so as for the resist to define apertures corresponding, on the one hand, to a microchannel to be obtained, and, on the other hand, to openings, the latter forming one or more lines extending, each, laterally across the second layer toward one of the apertures that corresponds to the microchannel to be obtained;
etching portions of the second layer in accordance with said apertures, the lithographic resist being used as a mask to protect residual portions of the second layer, to structure the second layer and thereby obtain
opposite, lateral walls of the microchannel, a bottom wall of which is defined by an exposed surface of the first layer, the bottom wall and the lateral walls forming boundaries of the microchannel, and
one or more lines of through holes corresponding to said one or more lines of openings, respectively; and
thermally oxidizing exposed surfaces of the second layer to obtain one or more electrical insulation barriers, wherein
each barrier of the one or more electrical insulation barriers comprises a respective one of the lines of through holes, each surrounded by an oxidized region of the material of the second layer, whereby the through holes alternate with oxidized portions of said oxidized region along said respective one of the lines, and
said each barrier extends, as a whole, laterally across the second layer up to one of the lateral walls, thereby delimiting two sections of the second layer on a same side of the microchannel.

16. The method according to claim 15, wherein the second layer is etched by etching by deep reactive ion etching.

17. The method according to claim 15, wherein the method further comprises bonding a glass lid to the second layer.

18. The method according to claim 15, wherein the method further comprises patterning at least one electrical contact pad, for the latter to be in electrical contact with at least one of said two sections, respectively.

19. The method according to claim 15, wherein the first layer and the second layer provided form part of a silicon-insulator-silicon structure, whereby the material of the second layer comprises silicon and the material of the first layer provided is a buried oxide layer, comprising silicon dioxide, and the first layer extends on a silicon wafer handle.

20. The method according to claim 19, wherein the method further comprises etching an opening in the silicon wafer handle, so as for the window to extend opposite the bottom wall of the microchannel.

\* \* \* \* \*